US009852837B2

(12) United States Patent
Lu

(10) Patent No.: US 9,852,837 B2
(45) Date of Patent: Dec. 26, 2017

(54) MULTI-WINDING HIGH SENSITIVITY CURRENT TRANSFORMER

(71) Applicant: General Electric Company, Schenectady, NY (US)

(72) Inventor: Dan Tho Lu, Minden, NV (US)

(73) Assignee: General Electric Company, Schenectady, NY (US)

( * ) Notice: Subject to any disclaimer, the term of this patent is extended or adjusted under 35 U.S.C. 154(b) by 709 days.

(21) Appl. No.: 14/166,562

(22) Filed: Jan. 28, 2014

(65) Prior Publication Data
US 2015/0212159 A1 Jul. 30, 2015

(51) Int. Cl.
| | |
|---|---|
| *G01R 31/34* | (2006.01) |
| *H01F 27/24* | (2006.01) |
| *G01R 15/18* | (2006.01) |
| *H01F 38/28* | (2006.01) |
| *H01F 38/30* | (2006.01) |

(52) U.S. Cl.
CPC .......... *H01F 27/24* (2013.01); *G01R 15/183* (2013.01); *H01F 38/28* (2013.01); *G01R 31/343* (2013.01); *H01F 2038/305* (2013.01)

(58) Field of Classification Search
None
See application file for complete search history.

(56) References Cited

U.S. PATENT DOCUMENTS

| | | | |
|---|---|---|---|
| 8,217,644 B2 | 7/2012 | Younsi et al. | |
| 2008/0129437 A1* | 6/2008 | Yoshizawa | ............ C22C 38/002 |
| | | | 336/220 |
| 2011/0006802 A1* | 1/2011 | Younsi | ................. G01R 15/185 |
| | | | 324/765.01 |
| 2012/0319699 A1* | 12/2012 | Watanabe | ............ G01R 31/025 |
| | | | 324/551 |

OTHER PUBLICATIONS

U.S. Appl. No. 14/073,727, filed Nov. 6, 2013, Ashok Kumar Yannam.
U.S. Appl. No. 14/073,752, filed Nov. 6, 2013, Dan Tho Lu.
(Continued)

*Primary Examiner* — Patrick Assouad
*Assistant Examiner* — Douglas X Rodriguez
(74) *Attorney, Agent, or Firm* — Fletcher Yoder, P.C.

(57) ABSTRACT

A system includes a sensor configured to detect an electrical leakage current associated with an operation of an industrial machine. The sensor includes a core and a first winding encircling a first portion of the core. The first winding includes a first number of turns. The first winding is configured to obtain a set of electrical current measurements associated with the operation of the industrial machine. The sensor includes a second winding encircling a second portion of the core. The second winding includes a second number of turns. The second winding is configured to obtain the set of electrical current measurements associated with the operation of the industrial machine. The first winding and the second winding are each configured to generate respective outputs based on the set of electrical current measurements. The respective outputs are configured to be used to reduce the occurrence of a distortion of the set of electrical current measurements based on a temperature of the core.

10 Claims, 3 Drawing Sheets

(56) References Cited

OTHER PUBLICATIONS

Stator Insulation Monitoring System, "Bently Nevada Stator Insulation Monitoring System," General Electric Company manual, Sep. 2013, 13 pages.
GE Measurement & Control, "Motor Stator Insulation Monitor," GE Product Information manual Sep. 2013, 2 pages.
Neti, Prabhakar and Wilhelm, Brant, "Online Health Monitoring of Motor Insulation," 2013, 13 pages.
Whitefield, C. David, "New online motor Stator Insulation Monitor(MSIM) for 3500 System," Orbit vol. 32 No. 1 Jan. 2012, 4 pages.

* cited by examiner

MULTI-WINDING HIGH SENSITIVITY CURRENT TRANSFORMER

The subject matter disclosed herein relates to industrial machines and, more specifically, to systems for monitoring leakage currents that may be associated with the industrial machines.

Certain synchronous and/or asynchronous machines such as electric motors and generators may experience leakage currents on the stator windings of the machines during operation. Specifically, because the stator windings may include metal windings in close proximity, the stator windings of the motor may be subject to inherent capacitance (e.g., capacitive current leakage). Electric machines may also experience leakage currents due to less than optimal or ineffective insulation protecting the stator windings (e.g., resistive current leakage). Sensors may be provided detect the leakage currents. Unfortunately, the sensors may be highly sensitive to ambient and/or operational temperature variations, and may thus generate distorted values for the detected leakage currents. Accordingly, it may be desirable to provide improved sensors for detecting leakage currents.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In accordance with a first embodiment, a system includes a sensor configured to detect an electrical leakage current associated with an operation of an industrial machine. The sensor includes a core and a first winding encircling a first portion of the core. The first winding includes a first number of turns. The first winding is configured to obtain a set of electrical current measurements associated with the operation of the industrial machine. The sensor includes a second winding encircling a second portion of the core. The second winding includes a second number of turns. The second winding is configured to obtain the set of electrical current measurements associated with the operation of the industrial machine. The first winding and the second winding are each configured to generate respective outputs based on the set of electrical current measurements. The respective outputs are configured to be used to reduce the occurrence of a distortion of the set of electrical current measurements based on a temperature of the core.

In accordance with a second embodiment, a non-transitory computer-readable medium having computer executable code stored thereon, the code includes instructions to receive a line voltage measurement associated with a first set of windings and a second set of windings coiled around a core of a current sensor, receive a plurality of electrical leakage current measurements via the current sensor, and calculate an amplitude and a phase angle of a respective output voltage of each of the first set of windings and the second set of windings. The amplitude and phase of the respective output voltages are referenced to the line voltage measurement. The code includes instructions to calculate a phase-shift angle and a magnetic permeability value corresponding to each of the first set of windings and the second set of windings based at least in part on the phase angle of the respective output voltages, and derive one or more correction factors based on the phase-shift angles and the magnetic permeability value. The one or more correction factors are configured to correct a temperature-based or aging-based distortion of the electrical leakage current measurements.

In accordance with a third embodiment, a system includes a processor configured to receive a line voltage measurement associated with a first set of windings and a second set of windings coiled around a core of a current sensor, to receive a plurality of electrical leakage current measurements via the current sensor, and to calculate an amplitude and a phase angle of a respective output voltage of each of the first set of windings and the second set of windings. The amplitude and phase of the respective output voltages are referenced to the line voltage measurement. The processor is configured to calculate a first phase-shift angle corresponding the first set of windings and a second phase-shift angle corresponding to the second set of windings based at least in part on the phase angle of the respective output voltages, to calculate a magnetic permeability value of the core of the current sensor based at least in part on the phase angle of the respective output voltages, and to derive one or more correction factors based on the phase-shift angles and the magnetic permeability value. The one or more correction factors are configured to correct a temperature-based or aging-based distortion of the electrical leakage current measurements.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
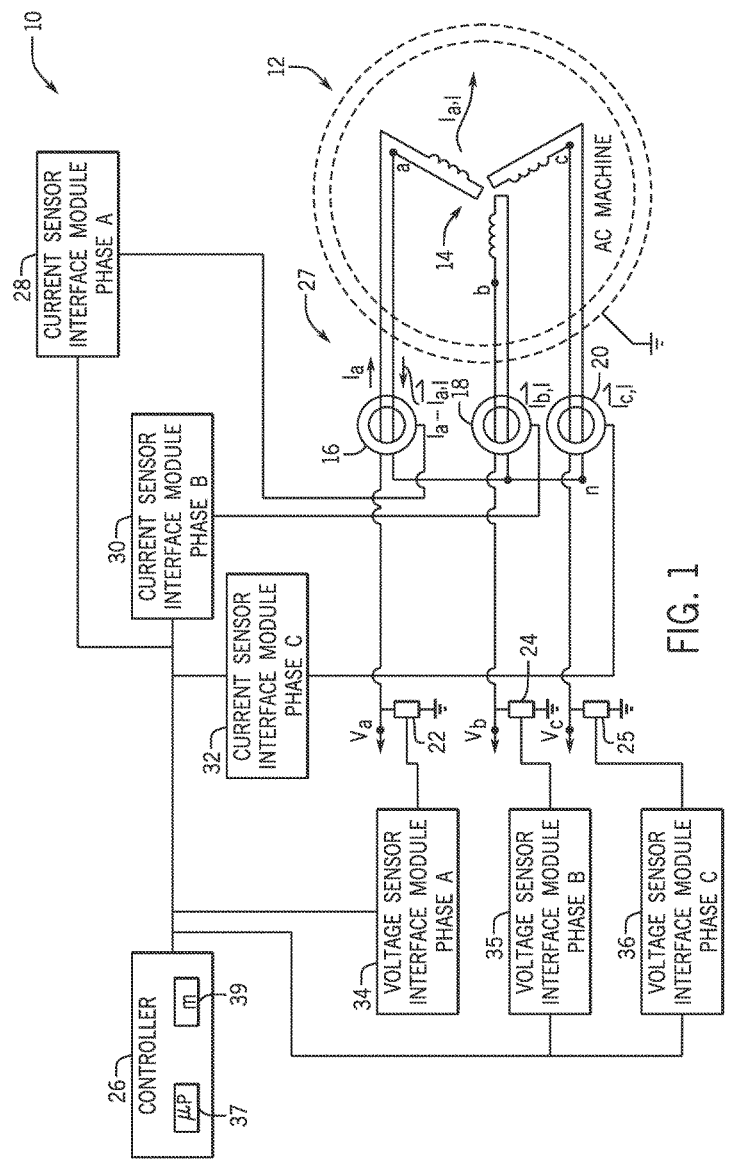
FIG. 1 is a block diagram of an embodiment of a industrial machine and control system including a controller, in accordance with present embodiments.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Present embodiments relate to a two-winding configuration current sensor that may be used to provide accurate measures of detected leakage currents by, for example, correcting and compensating for the ambient and/or operational temperature variations of the sensor and/or mechanical stress on the core of the sensor. In one embodiment, the sensor may include a high sensitivity current transformer (HSCT). Specifically, the sensor may include a first set of windings with a first number of turns and second set of windings with a second number of turns. The first set of windings and the second set of windings may be coiled independently on the core of the sensor, such that the sensor provides at least two voltage outputs. In one embodiment, the two outputs may be connected to the input of a signal conditioning circuit with a multiplexing functionality to ensure that only one signal of the two voltage outputs of the sensor is electrically connected and processed per time period. Based on the two voltage outputs (and other measurements obtained by the current sensor and high voltage sensor) and the parameters of the sensor, the respective phase-shifts corresponding to the first set of windings and the second set of windings and the instantaneous permeability (e.g., corresponding to the immediate ambient and/or operational temperature) of the core of the sensor may be calculated and used to compensate for, or correct any errors that may have become present, for example, in the detected leakage currents. Moreover, based on the two voltage outputs, and, by extension, the respective phase-shifts of the first set of windings and the second set of windings, an indication as to whether the detected leakage currents include capacitive leakage currents, resistive leakage currents, or a combination of capacitive leakage currents and resistive leakage currents may be provided. Indeed, although the present embodiments may be discussed primarily with respect to a current sensor, it should be appreciated that the techniques described herein may be applied to any core-based sensor and/or other core-based device.

With the foregoing in mind, it may be useful to describe an industrial machine and control system, such as an example industrial machine and control system 10 illustrated in FIG. 1. As depicted, the system 10 may include an industrial machine 12 including a number of stator windings 14, a number of leakage current sensors 16, 18, and 20, and a number of voltage sensors 22, 24, and 25 all communicatively coupled to a controller 26. The industrial machine 12 may be any single or multi-phase synchronous, asynchronous, or induction machine useful in converting an electrical power input into a mechanical output to drive another system or device. For example, in certain embodiments, the industrial machine 12 may be a single or multi-phase electric motor, an induction motor, or, in other embodiments, a generator. Thus, as illustrated, the industrial machine 12 may include the stator windings 14. As it may be appreciated, the stator windings 14 may include single or polyphase conductors (e.g., phases a, b, c) that may be coiled around an iron magnetic core to form magnetic poles when energized with an electrical current. Although not illustrated, it should be appreciated that the magnetic field generated by the windings of the stator windings 14 may rotate a drive shaft.

As previously noted, a number of leakage current sensors 16, 18, and 20 may be communicatively coupled to each of three-phases (e.g., phases a, b, c) of the stator windings 14, and, by extension, the machine 12. In certain embodiments, the leakage current sensors 16, 18, and 20 may include, for example, high sensitivity current transformers (HSCTs), other current transformers (CTs), or any devices that output a signal (e.g., AC/DC voltage or current) proportional to a detected electrical current flowing through the electrically and/or communicatively coupled phase conductors 27. As also illustrated, a number of voltage sensors 22, 24, and 25 may be communicatively coupled to each of the three-phases (e.g., phases a, b, c) of the stator windings 14, and by extension, the machine 12. The voltage sensors 22, 24, and 25 may include, for example, any of various high voltage sensors (HVSs) (e.g., high voltage dividers) useful in producing a voltage proportional to a detected voltage on the three-phase conductors 27.

In certain embodiments, the leakage current sensors 16, 18, and 20 may be communicatively coupled to corresponding leakage current sensor interface modules 28, 30, and 32 corresponding to each of the three-phase conductors 27 (e.g., phases a, b, c) of the stator windings 14. The leakage current sensor interface modules 28, 30, and 32 may be useful in processing the outputs of the leakage current sensors 16, 18, and 20 (e.g., on-site), and subsequently delivering the leakage current sensor outputs to the controller 26. The leakage current sensors 16, 18, and 20 may also include a processor (e.g., microcontroller) to perform one or more processing operations on the leakage current sensor outputs before transmission of the outputs to the current sensor interface modules 28, 30, and 32. Similarly, the voltage sensors 22, 24, and 25 may be communicatively coupled to corresponding voltage sensor interface modules 34, 35, and 36 corresponding to the three-phase conductors 27 (e.g., phases a, b, c) of the stator windings 14. The voltage sensor interface modules 34, 35, and 36 may be useful in processing the outputs of the voltage sensors 22, 24, and 25 (e.g., on-site), and subsequently delivering the voltage sensor outputs to the controller 26. Thus, it should be appreciated that the current sensor interface modules 28, 30, and 32 and the voltage sensor interface modules 34, 35, and 36 may include one or more processors (e.g., such as a processor 37) and memory (e.g., such as a memory 39) to perform the aforementioned functions and/or operations.

In certain embodiments, the controller 26 may be suitable for generating and implementing various control algorithms and techniques to control the current and/or voltage of the stator windings 14, and by extension, the output (e.g., speed, torque, frequency, and so forth) of the machine 12. The controller 26 may also provide an operator interface through which an engineer or technician may monitor the components of the system 10 such as, components (e.g., leakage current sensors 16, 18, and 20 and voltage sensors 22, 24, and 25) of the machine 12. Accordingly, as will be further appreciated, the controller 26 may include one or more processors 37 that may be used in processing readable and executable computer instructions, and a memory 39 that may be used to store the readable and executable computer instructions and other data. These instructions may be encoded in programs stored in tangible non-transitory computer-readable medium such as the memory 39 and/or other storage of the controller 26. Furthermore, the one or more processors 37 and memory 39 may allow the controller 26 to be programmably retrofitted with the instructions to carry out one or more of the presently disclosed techniques without the need to include, for example, additional hardware components.

In certain embodiments, the controller 26 may also host various industrial control software, such as a human-machine interface (HMI) software, a manufacturing execution system (MES), a distributed control system (DCS), and/or a supervisor control and data acquisition (SCADA) system. For example, in one embodiment, the controller 26 may be a Motor Stator Insulation Monitor (MSIM)™ available from General Electric Co., of Schenectady, N.Y. Thus, the control system may be a standalone control system, or one of several control and/or monitoring systems useful in monitoring and regulating the various operating parameters of the machine 12. As will be further appreciated, the controller 26 may be used to monitor leakage currents $\vec{I}_{a,l}$, $\vec{I}_{b,l}$, and $\vec{I}_{c,l}$, and/or dissipation factor (DF) that may be associated with the three-phase (e.g., phases a, b, c) stator windings 14. Specifically, leakage currents $\vec{I}_{a,l}$, $\vec{I}_{b,l}$, and $\vec{I}_{c,l}$, may appear in one or more phases of the stator windings 14 in the forms of capacitive leakage currents and/or resistive leakage currents. The total leakage current (e.g., the vector sum of the capacitive leakage currents and the resistive leakage currents) may possibly cause mechanical damage or thermal damage to the stator windings 14 if left to persist.

Figure 2:
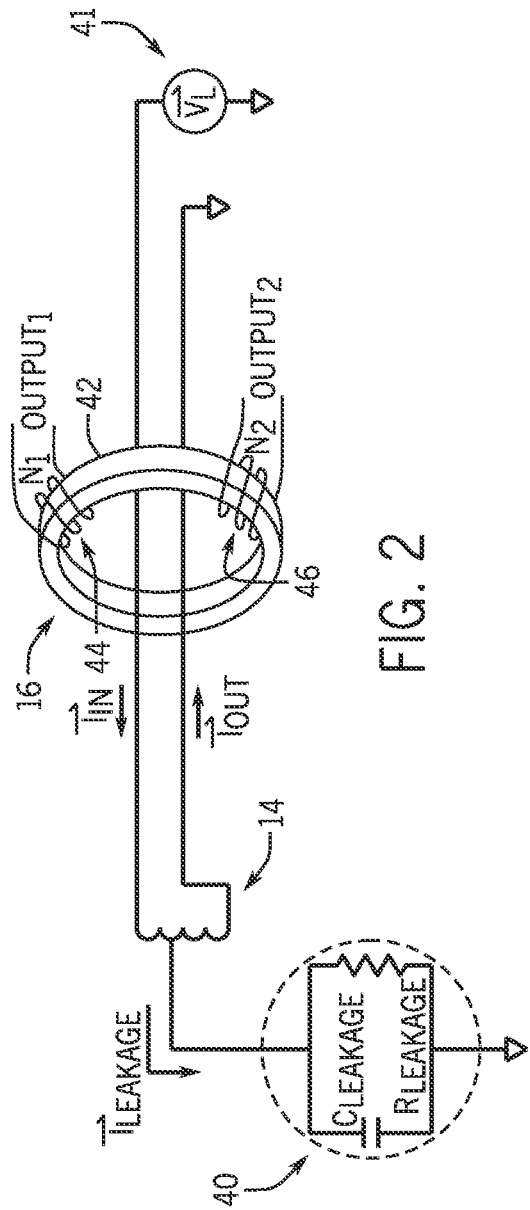
FIG. 2 is a block diagram of an embodiment of an equivalent circuit of the system of FIG. 1 including a first winding and a second winding, in accordance with present embodiments.

Turning now to FIG. 2, a block diagram of an embodiment of the sensor 16 is illustrated. For the purpose of illustration, henceforth, the sensors 16, 18, and 20 may be discussed with respect to only sensor 16 (e.g., phase a). However, it should be appreciated that the present embodiments may be implemented with respect to each of the sensors 16, 18, and 20, or other sensors 16, 18, and 20 that may be present in the system 10. Furthermore, in FIG. 2, at least one of the phases (e.g., phase a) of the industrial machine 12 is depicted as an equivalent load 14 and a path in an insulation material is illustrated as an equivalent circuit 40, including a capacitance $C_{leakage}$ and a resistance $R_{leakage}$. The system 10 of FIG. 2 may also include an equivalent voltage source 41, which may be one phase of a polyphase voltage source (e.g., single or polyphase grid power) that may be used to provide power to the industrial machine 12 and/or equivalent load 14.

As previously noted with respect to FIG. 1, the sensor 16 may be any device useful in measuring low level leakage current of the machine stator windings 14. Specifically, as in illustrated in FIG. 2, in certain embodiments, the sensor 16 may be a magnetic coil based current transducer that includes a core 42 and core windings 44, 46. The core 42 of the sensor 16 may include high permeability magnetic materials such as, for example, high nickel, iron, supermalloy, or other similar high permeability magnetic materials that may exhibit a high sensitivity to mechanical stress. As will be further appreciated, the sensing functionality of the sensor 16 may be very sensitive to ambient and/or operational temperature variations. Particularly, the thermal effect on the core windings 44, 46 of sensor 16 may cause the core 42 of the sensor 16 to experience substantial mechanical stress. Indeed, the response of the sensor 16 due to the temperature variations, and, by extension, the mechanical stress may be highly nonlinear. This may result in the sensor 16 generating distorted leakage current measurement values that vary undesirably according to the ambient and/or operational temperature of the sensor 16.

Specifically, the sensor 16 may include a highly nonlinear temperature response, and thus the sensor 16 may be very sensitive to ambient and/or operational temperature variations. In one embodiment, the highly nonlinear temperature variation may be within a specific operating temperature range. For example, the signal phase of the voltage output of the sensor 16 may vary from approximately 20% between 70 C to 0 C degree and up to approximately 80% between 0 C to −20 C degree. Specifically, lower ambient temperatures (e.g., cooler or cold temperatures) may cause the sensor 16 core 42 to contract and experience significant mechanical stress. The core 42 may also experience a material change (e.g., a change in molecular and/or device characteristics). This may lead to a decrease in the permeability of the magnetic material of the core 42, and thus decrease the inductance of the core windings 44 and 46.

Accordingly, to compensate for the mechanical stress and core material change, in certain embodiments, the sensor 16 may include at least two core windings 44, 46 each coiled around the core 42. The core windings 44, 46 may be used to sense and measure leakage current by measuring the differential current from electrical power inputs $I_{in}$ and outputs $I_{out}$. Based on the measurements of the vector current inputs $I_{in}$, outputs $I_{out}$ and line voltage, the permeability of the core 42 may be calculated (e.g., calculated by the current sensor interface module 28 or other processor that may be included as part of the sensor 16). The sensor 16 output signal phase-shift may be inversely proportional to the core windings 44, 46 inductance (e.g., $L_1$, $L_2$) and proportional to the loading resistance (e.g., $R_L$).

In certain embodiments, the core windings 44, 46 may be used to measure the magnitude and phase of the current inputs $I_{in}$ and outputs $I_{out}$ together, measurements that may be corrected for variations due to temperature variations, other thermal effects, and/or aging effects on the core 42 material (e.g., permeability creeping). Specifically, the windings 44 may be configured to have a specified number of turns ($N_1$), and the windings 46 may be configured to have a specified number of turns ($N_2$). In certain embodiments, the ratio of the number of turns between the windings 44 and the windings 46 may be a 1.5:1 ratio, 2:1 ratio, a 3:2 ratio, a 4:3 ratio, or other ratio in which the number of turns ($N_1$) is not equal to the number of turns ($N_2$). As illustrated, the windings 44 and the windings 46 may be wound separately and independently around the core 42 of the sensor 16. Thus, in measuring a current, the sensor 16 may give at least two independent voltage outputs (e.g., Output$_1$ and Output$_2$).

Figure 3:
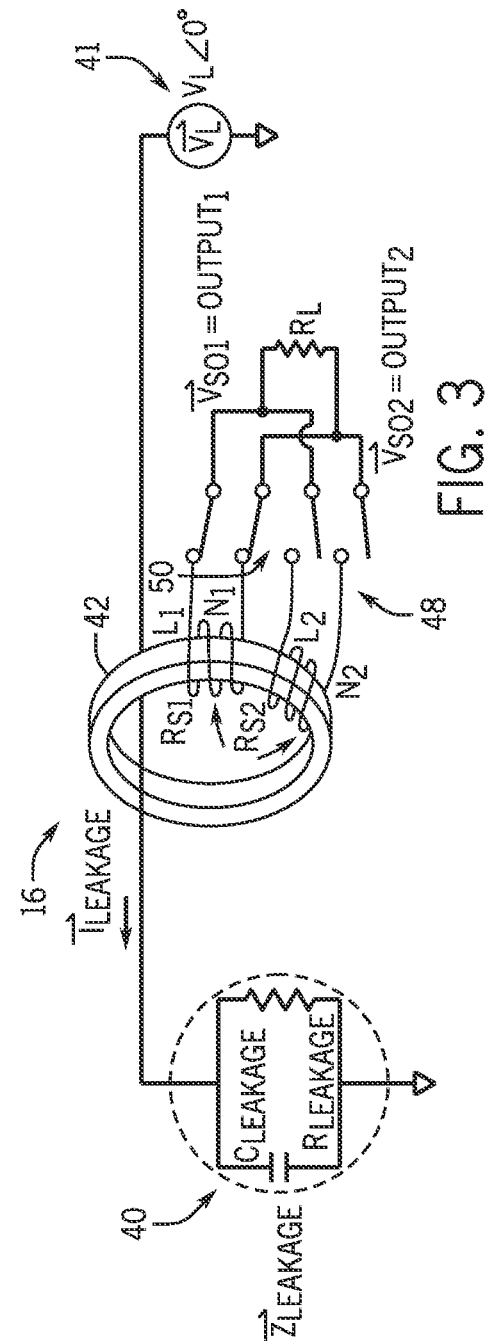
FIG. 3 is a detailed block diagram of the equivalent circuit of FIG. 2 including a signal conditioning circuit, in accordance with present embodiments.

In certain embodiments, as illustrated in FIG. 3, the Output$_1$ and Output$_2$ (e.g., corresponding to the voltage on the windings 44 and the windings 46) of the sensor 16 may be each coupled to an input of a signal conditioning circuit 48 (e.g., which may be included within one or more of the current sensor interface modules 28, 30, and 32) that may include a multiplexing functionality (e.g., multiplexing switches 50) to ensure that only one signal of the Output$_1$ and Output$_2$ are electrically connected and processed at a time. Based on the measurements of Output$_1$ and Output$_2$ of the sensor 16 and the measured voltage of the voltage source 41 (e.g., measured by the voltage sensor 22), the instantaneous permeability (e.g., the permeability corresponding to the immediate ambient and/or operational temperature) of the core 42 of the sensor 16 may be calculated (e.g., calculated via the current sensor interface module 28 or other processor that may be included as part of the sensor 16). The current sensor interface module 28 (or current sensor interface modules 30 and 32) may then use the instantaneous permeability to compensate for any errors that may, for example, become present in the detected leakage current signals $\vec{I}_{a,l}$, $\vec{I}_{b,l}$, and $\vec{I}_{c,l}$. Indeed, as will be further appreciated, based on the measurements of Output$_1$ and Output$_2$, the current sensor interface module 28 (or current sensor interface modules 30 and 32) may measure a phase-shift $(\Theta+\alpha)°$ measured by the core windings 44, and a phase-shift $(\Theta+\beta)°$ measured by the core windings 46. Specifically, as will be further appreciated, the current sensor interface module 28 (or current sensor interface modules 30 and 32) may use Output$_1$ and Output$_2$ to calculate the specific phase angle $\Theta$ associated with the detected leakage current signals $\vec{I}_{a,l}$, $\vec{I}_{b,l}$, and $\vec{I}_{c,l}$, and the specific phase angles $\alpha$ and $\beta$ associated with phase shifts that may be introduced by the core windings 44 and 46, respectively. In this way, the current sensor interface module 28 (or current sensor interface modules 30 and 32) may provide an indication as to whether the detected leakage currents $\vec{I}_{a,l}$, $\vec{I}_{b,l}$, and $\vec{I}_{c,l}$ includes capacitive leakage currents, resistive leakage currents, or a combination of capacitive leakage currents and resistive leakage currents.

For example, in certain embodiments, the sensor 16 (or sensors 18 and 20) may obtain the leakage current measurements $\vec{I}_{a,l}$, $\vec{I}_{b,l}$, and $\vec{I}_{c,l}$, which may be expressed as:

$$\overrightarrow{I_{Leakage}} = \frac{\overrightarrow{V_{Source}}}{\overrightarrow{Z_{Leakage}}} = I_{Leakage} \angle \Theta°. \quad \text{equation (1)}$$

The voltage outputs Output$_1$ and Output$_2$ may be then calculated (e.g., by way of one or more of the current sensor interface modules 28, 30, and 32 or other processor(s) that may be included as part of the respective sensors 16, 18, 20) as:

$$\overrightarrow{V_{output_1}} = \overrightarrow{H_1} \times \overrightarrow{I_{Leakage}} = H_1 \angle \alpha° \times I_{Leakage} \angle \Theta° = V_{Output_1} \angle (\Theta+\alpha)° \quad \text{equation (2),}$$

and $$\overrightarrow{V_{output_2}} = \overrightarrow{H_2} \times \overrightarrow{I_{leakage}} = H_2 \angle \beta° \times I_{Leakage} \angle \Theta° = V_{Output_2} \angle (\Theta+\beta)° \quad \text{equation (3).}$$

As noted above, phase angle $\Theta$ may be the phase angle of the detected leakage current $\overrightarrow{I_{leakage}}$. The phase angles $\alpha$ and $\beta$ in the above-illustrated equation (2) and equation (3) may represent the respective phase shifts that may be introduced by the core windings 44, 46 of the sensor 16 (or sensors 18 and 20) due to, for example, distortions based on the ambient and/or operational temperature and/or aging core of the sensor 16, and, by extension, the mechanical stress on the core 42 of the sensor 16 (or sensor 18 and 20). Similarly, $\vec{H}_1$ and $\vec{H}_2$ may represent the respective transfer functions used to describe the functionality of the sensor 16 (or sensors 18 and 20) corresponding to the windings 44, 46. Accordingly, based on the transfer functions $\vec{H}_1$ and $\vec{H}_2$, the respective phase-shift angles $\alpha$ and $\beta$ and the magnetic permeability (e.g., which may be variable as a function of the temperature and age of the core 42) may be then calculated (e.g., by way of one or more of the current sensor interface modules 28, 30, and 32 or other processor(s) that may be included as part of the respective sensors 16, 18, and 20) in accordance with the following equations:

$$\tan(\alpha) = \frac{R_{S_1} + R_L}{\omega L_1} = \frac{S_1}{\mu}, \quad \text{equation (4)}$$

and $$\tan(\beta) = \frac{R_{S_2} + R_L}{\omega L_2} = \frac{S_2}{\mu}. \quad \text{equation (5)}$$

Thus, the instantaneous permeability $\mu$ (e.g., the permeability corresponding to the immediate ambient and/or operational temperature and age) of the core 42 of the sensor 16 and the phase-shift angles $\alpha$ and $\beta$ may be calculated based on the independent voltage outputs Output$_1$ and Output$_2$) detected via the respective core windings 44 and 46 of the sensor 16. Specifically, as illustrated, the phase-shift angles $\alpha$ and $\beta$ may be inversely proportional to windings 44 and 46 inductance (e.g., $L_1$, $L_2$) and proportional to the loading resistance (e.g., $R_L$) and the coil resistance (e.g., $R_{S2}$) of the sensor 16. The current sensor input module 28 (or current sensor input modules 30 and 32) may then use the instantaneous permeability to compensate for, or correct any errors that may have become present, for example, in the detected leakage current $\overrightarrow{I_{Leakage}}$. In this way, the sensor 16 (or sensors 18 and 20) may provide accurate measures of the leakage current signals $\vec{I}_{a,l}$, $\vec{I}_{b,l}$, and $\vec{I}_{c,l}$, for example, irrespective of the ambient and/or operational temperature or age of the sensor 16 (or sensors 18 and 20) and/or the mechanical stress of the core 42 based thereon. Moreover, the current sensor interface module 28 (or current sensor interface modules 30 and 32) may provide an indication as to whether the detected leakage current $\overrightarrow{I_{Leakage}}$ includes a capacitive leakage current, a resistive leakage current, or a combination of capacitive leakage current and resistive leakage current.

Figure 4:
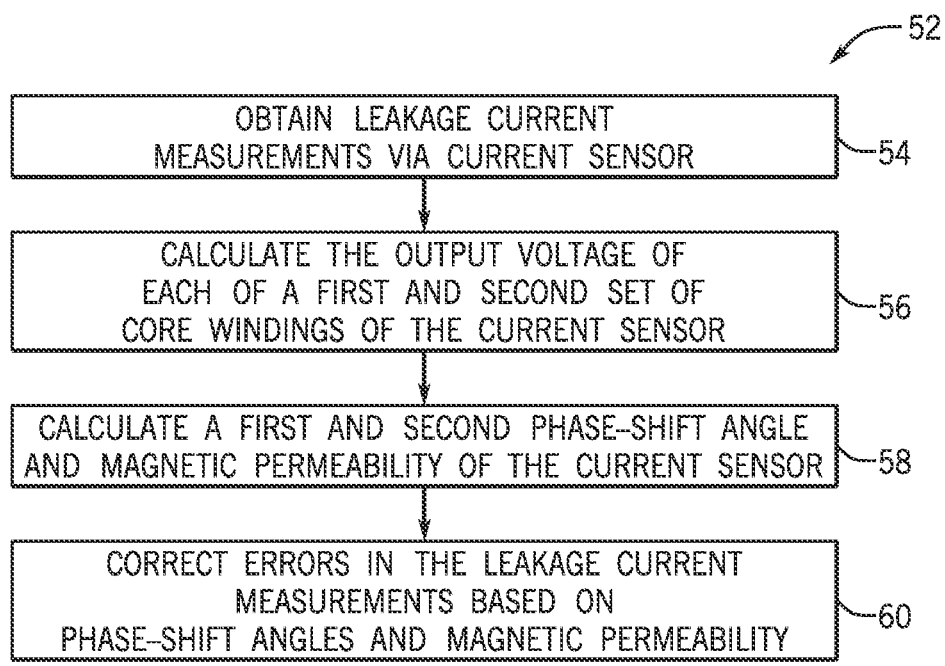
FIG. 4 is a flow diagram illustrating an embodiment of a process useful in correcting temperature-based distortions of detected leakage current signals, in accordance with present embodiments.

Turning now to FIG. 4, a flow diagram is presented, illustrating an embodiment of a process 52 useful in correcting temperature-based and aging-based distortions of detected leakage current signals, by using, for example, the current sensor interface modules 28, 30, and 32 or one or more processors that may be included as part of the sensors 16, 18, and 20 included in the system 10 depicted in FIG. 1. The process 52 may include code or instructions stored in a non-transitory machine-readable medium (e.g., such as the memory 39) and executed, for example, by the one or more the current sensor interface modules 28, 30, and 32 and/or other processing devices. The process 52 may begin with one or more of the sensors 16, 18, and 20 obtaining (block 54) leakage current measurements (e.g., leakage current signals $\vec{I}_{a,l}$, $\vec{I}_{b,l}$, and $\vec{I}_{c,l}$) and line voltage measurement. The process 52 may continue with the one or more current sensor interface modules 28, 30, and 32 and/or other processing devices (e.g. included as part of the one or more sensors 16, 18, and 20) calculating (block 56) the output voltage (e.g., Output$_1$ and Output$_2$) of each of a first and second set of core windings 44 and 46, and determining the phase angles $(\Theta+\alpha)°$ and $(\Theta+\beta)°$ (e.g., in reference to the line voltage) of the output voltage (e.g., Output$_1$ and Output$_2$) of each of a first and second set of core windings 44 and 46.

The process 52 may then continue with the one or more the current sensor interface modules 28, 30, and 32 and/or other processing devices (e.g. included as part of the one or more sensors 16, 18, and 20) calculating (block 58) first and second phase-shift angles $\alpha°$ and $\beta°$ that may be introduced by the respective windings 44 and 46 and the magnetic permeability value μ of the core 42 based, for example, on the respective output voltages (e.g., Output$_1$ and Output$_2$) and the associated phase angles (Θ+α)° and (Θ+β)° output voltages (e.g., Output$_1$ and Output$_2$) of the core windings 44 and 46. The process 52 may then conclude with the one or more the current sensor interface modules 28, 30, and 32 and/or other processing devices (e.g. included as part of the one or more sensors 16, 18, and 20) correcting (block 60) one or more temperature-based and aging based errors and/or distortions in the leakage current measurements (e.g., leakage current signals $\vec{I}_{a,l}$, $\vec{I}_{b,l}$, and $\vec{I}_{c,l}$) based on the calculated first and second phase-shift angles α° and β° associated with the windings 44 and 46 and the magnetic permeability value of the core 42. Specifically, one or more corrections factors may be generated. As previously noted above with respect to FIG. 3, in this way, the sensor 16 (or sensors 18 and 20) may provide accurate measurements of the leakage current signals $\vec{I}_{a,l}$, $\vec{I}_{b,l}$, and $\vec{I}_{c,l}$, for example, irrespective of the ambient and/or operational temperature and age of the sensor 16 (or sensors 18 and 20) and/or the mechanical stress of the core 42 based thereon. Furthermore, the current sensor interface module 28 (or current sensor interface modules 30 and 32) may provide an indication as to whether the detected leakage current measurements (e.g., leakage current signals $\vec{I}_{a,l}$, $\vec{I}_{b,l}$, and $\vec{I}_{c,l}$) includes capacitive leakage currents, resistive leakage currents, or a combination of capacitive leakage current and resistive leakage current.

Technical effects of the present embodiments relate to a two-winding configuration current sensor that may be used to provide accurate measures of detected leakage currents by, for example, correcting and compensating for the ambient and/or operational temperature variations of the sensor and/or mechanical stress on the core of the sensor. In one embodiment, the sensor may include a high sensitivity current transformer (HSCT). Specifically, the sensor may include a first set of windings with a first number of turns and second set of windings with a second number of turns. The first set of windings and the second set of windings may be coiled independently on the core of the sensor, such that the sensor provides at least two voltage outputs. In one embodiment, the two outputs may be connected to the input of a signal conditioning circuit with a multiplexing functionality to ensure that only one signal of the two voltage outputs of the sensor is electrically connected and processed per time period. Based on the two voltage outputs (and other measurements obtained by the current sensor and high voltage sensor) and the parameters of the sensor, the respective phase-shifts corresponding to the first set of windings and the second set of windings and the instantaneous permeability (e.g., corresponding to the immediate ambient and/or operational temperature) of the core of the sensor may be calculated and used to compensate for, or correct any errors that may have become present, for example, in the detected leakage currents. Moreover, based on the two voltage outputs, and, by extension, the respective phase-shifts of the first set of windings and the second set of windings, an indication as to whether the detected leakage currents include capacitive leakage currents, resistive leakage currents, or a combination of capacitive leakage currents and resistive leakage currents may be provided.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
    a sensor configured to detect an electrical leakage current associated with an operation of an industrial machine; comprising:
        a core;
        a first winding encircling a first portion of the core, wherein the first winding comprises a first number of turns, and wherein the first winding is configured to obtain a set of electrical current measurements associated with the operation of the industrial machine;
        a second winding encircling a second portion of the core, wherein the second winding comprises a second number of turns, wherein the second winding is configured to obtain the set of electrical current measurements associated with the operation of the industrial machine, and wherein the first number of turns of the first winding is not equal to the second number of turns of the second winding;
        wherein the first winding and the second winding are each configured to generate respective outputs based on the set of electrical current measurements, wherein the respective outputs are configured to be used to reduce the occurrence of a distortion of the set of electrical current measurements based on a temperature of the core, and wherein the sensor is configured to transmit the respective outputs to a controller coupled to the sensor to calculate a phase-shift angle and a magnetic permeability value corresponding to each of the first set of windings and the second set of windings.

2. The system of claim 1, wherein the first number of turns of the first winding and the second number of turns of the second winding comprises a ratio of approximately 3:2 or approximately 2:1.

3. The system of claim 1, wherein the sensor comprises a high sensitivity current transformer (HSCT).

4. The system of claim 1, wherein the core comprises a high-permeability magnetic core.

5. The system of claim 4, wherein the high-permeability magnetic core comprises, high nickel, iron, a supermalloy, or any combination thereof.

6. The system of claim 1, wherein the first winding and the second winding are configured to couple to a signal conditioning circuit, wherein the signal conditioning circuit comprises a multiplexer configured to transmit the respective outputs one at a time for processing.

7. The system of claim 1, wherein the first winding and the second winding are configured to operate independently with respect to one another.

8. The system of claim 1, comprising a second sensor configured to detect an electrical voltage associated with the operation of the industrial machine.

9. The system of claim 1, wherein the industrial machine comprises a synchronous motor, an induction motor, or a generator.

10. The system of claim 1, comprising a second sensor and a third sensor each corresponding to a respective conductor coupled to the industrial machine, and wherein each of the second sensor and the third sensor comprises a respective first winding and a respective second winding.

\* \* \* \* \*